(12) United States Patent
Shin

(10) Patent No.: US 6,862,248 B2
(45) Date of Patent: Mar. 1, 2005

(54) METHOD FOR MASKING RINGING IN DDR SDRAM

(75) Inventor: Beom Ju Shin, Kyoungki-do (KR)

(73) Assignee: Hynix Semiconductor Inc., Kyoughi-do (KR)

( * ) Notice: Subject to any disclaimer, the term of this patent is extended or adjusted under 35 U.S.C. 154(b) by 0 days.

(21) Appl. No.: 10/736,824

(22) Filed: Dec. 16, 2003

(65) Prior Publication Data

US 2004/0264290 A1 Dec. 30, 2004

(30) Foreign Application Priority Data

Jun. 28, 2003 (KR) .................................. 10-2003-0042914

(51) Int. Cl.[7] .................................................. G11C 8/00
(52) U.S. Cl. .............. 365/233; 365/189.05; 365/230.04
(58) Field of Search ............................ 365/233, 189.05, 365/230.04, 239

(56) References Cited

U.S. PATENT DOCUMENTS

| | | | |
|---|---|---|---|
| 5,165,087 A | 11/1992 | Schwee | |
| 6,034,916 A | 3/2000 | Lee | |
| 6,064,625 A | 5/2000 | Tomita | |
| 6,282,132 B1 | 8/2001 | Brown et al. | |
| 6,292,410 B1 | 9/2001 | Yi et al. | |
| 6,404,697 B1 * | 6/2002 | Ryu et al. | 365/230.04 |
| 6,445,642 B2 | 9/2002 | Murakami | |
| 6,459,651 B1 | 10/2002 | Lee et al. | |
| 6,477,710 B1 | 11/2002 | Ojoyeyi | |
| 6,498,766 B2 | 12/2002 | Lee et al. | |
| 6,603,706 B1 * | 8/2003 | Nystuen et al. | 365/233 |
| 2001/0004335 A1 | 6/2001 | Murakami | |
| 2001/0043505 A1 | 11/2001 | Lee et al. | |
| 2003/0021164 A1 | 1/2003 | Yoo et al. | |

FOREIGN PATENT DOCUMENTS

| | | |
|---|---|---|
| JP | 7141286 | 6/1995 |
| JP | 10207771 | 8/1998 |
| JP | 11288590 | 10/1999 |
| JP | 20000043398 | 2/2000 |
| JP | 20000156082 | 6/2000 |
| JP | 20010236782 | 8/2001 |
| JP | 20020222591 | 8/2002 |

* cited by examiner

Primary Examiner—Huan Hoang
(74) Attorney, Agent, or Firm—Ladas & Parry LLP

(57) ABSTRACT

A method for masking a ringing in a DDR SDRAM comprises in a write mode, generating first and second synchronizing signals by means of a DQS signal inputted from an exterior circuit, in order to synchronize input data, latching data in odd sequences from among the inputted data, which are sequentially inputted, at a rising edge of the first synchronizing signal, and latching data in even sequences from among the data, which are sequentially inputted, at a rising edge of the second synchronizing signal, aligning the data in odd sequences and the data in even sequences at a falling edge of the DQS signal so that the odd and even sequenced data has the same synchronized timing, and blocking activation of the second synchronizing signal by means of a first control signal, the a first control signal being synchronized with the falling edge of the last valid DQS signal that is normally inputted, so as to enable the blocking step and thereby masking the ringing phenomenon. In the method for masking the ringing phenomenon, the point at which the DIS_DSB signal is enabled in a low state is synchronized with the last falling edge of the normal DQS signal, and therefore the DSF2 signal is disabled.

5 Claims, 8 Drawing Sheets

METHOD FOR MASKING RINGING IN DDR SDRAM

BACKGROUND OF THE INVENTION

1. Field of the Invention

The present invention relates generally to a method for masking a ringing phenomenon in a DDR SDRAM, and more particularly to a method for masking a ringing phenomenon in a DDR SDRAM which can mask a write fail due to a ringing phenomenon of a DQS signal applied in a write operation in the DDR SDRAM.

2. Description of the Background Art

In general, when a double data rate (DDR) SDRAM performs a write operation, the DDR SDRAM latches data at a rising and a falling edge of a DQS signal, and thus operates twice as fast as the frequency of a clock signal CLK. That is, it operates at double data rate (hereinafter, referred to as a DDR). However, such a DDR operation is performed in only an input/output buffer, and the operation in the DDR SDRAM is performed at one-clock intervals as in the operation of an SDRAM.

Further, in order to realize such a DDR operation, during operation of the DDR SDRAM, two DQS signals DSR2 and DSF2 are generated and data are latched at a rising edge of each of the signals. As will be described later, the DSR2 signal has the same phase as that of the DQS signal, the DSF2 signal has a phase opposite to that of the DQS signal, and these two signals are both used for latching input data in a data buffer.

Hereinafter, a general or conventional write operation of the DDR SDRAM will be described with reference to the drawing figures.

FIG. 1 is a time chart illustrating a general write operation of a known DDR SDRAM.

In FIG. 1, "CLK" represents an exterior clock signal, "DQ" represents data inputted from an exterior circuit, "DINR6" represents data which is synchronized with a rising edge of a DQS signal and is then latched, "ALGN_R" and an "ALGN_F" represent data aligned after being latched at a falling edge of the DQS signal, a data input strobe pulse (DINSTP) latches the aligned data (i.e., the ALGN_R and the ALGN_F signals) at its own rising edge and sends the latched data to a global input/output line (GIO), and "GIO_E" and "GIO_O" represent respectively an even and odd global bus line through which data are transmitted inside of the DDR SDRAM. Further, "tDQSS" represents the time until the DQS signal shifts to a high level from after a write command is applied, D1, D2, D3, and D4 represent continuously applied data, which normally are input in bursts, (a burst length comprises four data units). For reference, in FIG. 1, "tDQSS" is set at 0.75*tCK, and "tCK" is a single period of a clock signal CLK.

In a general write operation of the DDR SDRAM as shown in FIG. 1, the data DQ are synchronized with the rising and the falling edge of the DQS signal to be latched. The data DINR6 latched at the rising edge of the DQS signal are delayed by 0.5*tCK and are aligned together with data latched at the falling edge. The data (ALGN_R and ALGN_F) aligned in such a manner are sent to the global input/output line "GIO_E and GIO_O" by the data strobe pulse signal (DINSTP), and are then written in a memory cell.

FIG. 2 is a block schematic diagram of a data buffer and a DQS buffer generally used in a DDR SDRAM. For reference, one example of the DQS buffer shown in FIG. 2 is used in the device shown in FIG. 4.

As shown in FIG. 2, the DQS buffer 18 receives a DQS signal and generates two internal signals DSR 2 and DSF 2. The first data DQ is applied to a D-flipflop (hereinafter, referred to as a F/F) 20 through the data buffer 16 "DQ buffer", is synchronized with a rising edge of the DSR 2 signal, and is then outputted as data "DINR6". The second data is applied to a D-F/F 24 through the data buffer 16 and is synchronized with a rising edge of the DSF 2 signal, and is then outputted as data "ALGN_F". That is, the first data "DINR6" is synchronized with the rising edge of the DSF 2 signal, and is then outputted as data "ALGN_R" through a D-F/F 22. Accordingly, it can be understood that the first data and the second data are synchronized with the rising edge of the DSF 2 signal and simultaneously outputted.

Next, FIG. 3 is a time chart when a ringing phenomenon is caused in a write operation in a DDR SDRAM. Herein, the operational conditions shown in FIG. 3 are the same as that in FIG. 1. However, FIG. 3 additionally shows two signals DSR 2 and DSF 2 generated by a DQS signal.

As shown in FIG. 3, there is a delay skew of 0.5*tCK in the data DINR6 and ALGN_F latched in a data input buffer after being synchronized with the rising edge of the DSR2 signal and DSF 2 signal. This delay skew is caused by the difference in the timing of 0.5*tCK between the rising edge of the DSR2 signal and the rising edge of the DSF 2 signal.

Herein, since an internal operation of the DDR SDRAM is performed on the basis of a rising edge of a clock signal CLK, such a data skew must be compensated for in the data input function. Accordingly, the data ALGN_R, which is obtained by delaying the data DINR6 latched at the rising edge of the DSR 2 signal by 0.5*tCK and aligning the delayed data, must be generated, so that the data ALGN_R must have the same timing as that of the data ALGN_F latched at the rising edge of the DSF 2 signal.

As shown in FIG. 3, during the write operation when the DQS comes into a high impedance state after the normal operation of the DQS signal is completed, a ringing phenomenon occurs. Generally, a write fail phenomenon, caused by the ringing of the DQS in a write operation, does not occur in all mother-boards. However, with the recent developments in memory cell technology, discrepancies resulting from write fail are increasing due to the number of memory modules built into the mother-boards or due to increases in clock frequency, etc. When the ringing phenomenon occurs, the DDR SDRAM determines the ringing of the DQS as a normal DQS signal and latches invalid data in both rising and falling edges of the ringing phenomenon. As a result, a discrepancy may result because the last two data D2 and D3 stored in a latch are replaced with the invalid data, and are then transmitted to a global input/output bus line.

FIG. 4 shows a DQS input buffer 18 providing a circuit for masking a write fail due to a ringing phenomenon, which is used for masking the aforementioned ringing phenomenon. As shown in FIG. 4, it can be understood that the DQS input buffer 18 is a circuit outputting a DSR2 and a DSF2 signal and controlling the DSF2 signal by the circuit 43 for masking the write fail due to the ringing.

In FIG. 4, "VREF" indicates a reference voltage and is about half of the driving voltage VDD of a DDR SDRAM. The indication "CLKP4" is a signal generated by adjusting the high level pulse width of a clock signal CLK, and "ENDINDS" represents a signal enabling the DQS buffer 18 during a write operation. Further, "DIS_DSB" represents a signal for removing a glitch of the DSF2, which may be caused by the ringing phenomenon present in a DQS signal applied during the write operation and masking a write fail.

As shown in FIG. 4, "tDA" represents a delay time, representing the time until a DQS signal applied to a comparator 39 passes through a delay section 40. The indication of "tDB" represents the delay time until a DSF2 signal is generated following a signal, which has been outputted from the circuit 43 for masking the write fail due to the ringing phenomenon, and until that signal is fedback and received. The indication of "tDC" represents a delay time until the DIS_DSB signal is generated after the DSF2 signal is received.

FIG. 5 is a time chart of the signals used in FIG. 4, wherein "tDG" represents the width of a glitch 110 that occurred as a result of a ringing phenomenon.

At the commencement of a write operation, two signals DSR2 and DSF2 are generated by reference to the DQS signal applied from an exterior circuit. The DSR2 signal has the same phase as that of the DQS signal, the DSF2 signal has a phase opposite to that of the DQS signal. As shown in FIG. 4, when the ringing phenomenon occurs in the DQS, the DSR2 and DSF2 but respond by generating the respective signals. Herein, since the alignment of data is performed at a falling edge of the DQS, (i.e., a rising edge of the DSF2) it is necessary to inactivate the DSF2 signal at a rising edge of the DQS signal when it occurs as a result of the ringing phenomenon, in order to prevent the ringing phenomenon from producing invalid data. Such a function is performed by the DIS_DSB signal. That is, while the DIS_DSB signal maintains a low level state, the DSF2 signal is inactivated.

Further, a predetermined time is necessary in order to ENABLE the DIS_DSB signal at a low level at the rising edge of the DQS signal when it is generated due to the ringing phenomenon. As shown in FIG. 4, this time tD is obtained by summing tDA and tDB and tDC.

Further, the time required to enable a falling portion of glitch 110 (see FIG. 5) of the DQS signal due to the ringing phenomenon to pass through a node AA in FIG. 4 is the sum of tDG and tDA on the basis of a rising portion of the glitch in the DQS signal. Herein, tDG represents the width of the glitch 110 (see FIG. 5).

In use of the above described conventional methods, the following problem may occur.

That is, as shown in FIGS. 4 and 5, when the falling portion of the glitch of the DQS signal due to the ringing phenomenon passes through the node AA before the DIS_DSB signal is enabled at a low level, a write fail due to the DQS ringing inevitably occurs in a NAND gate receiving the signal at the node AA.

That is, under the condition in which tD is larger than (tDG+tDA), the conventional circuit for masking the ringing cannot prevent the write fail from occurring. This condition may be calculated by an expression, (tDA+tDB+tDC)>(tDG+tDA), which can be shortened to a final expression, (tDB+tDC+tDG).

These problems of the conventional method can be better understood by reference to FIG. 6.

FIG. 6 is another time chart of the signals used in FIG. 4.

As shown in FIG. 6, the DSR2 and DSF2 signals are generated after being synchronized with the rising and falling edge of the DQS signal due to the ringing phenomenon. Herein, when the glitch signal due to the ringing has a narrow pulse width even through the DIS_DSB signal, which responds to the rising portion of the glitch signal of the DQS signal due to the ringing to disable the operation of the DSF2 signal, shifts at a low level, the DSF2 signal normally operates. That is, when the DQS glitch signal due to the ringing has the narrow pulse width, the DSF2 signal cannot be adjusted by a time delay of the circuit for masking the ringing. In other words, in the prior art, when a glitch due to the DQS ringing has a very narrow width, there are cases in which the write fail cannot be prevented from occurring.

This problem of the prior art is caused by enabling the DIS_DSB signal at the rising edge of the DQS signal, in order to prevent the glitch to be sent to the DSF2 as a result of the ringing (see FIG. 6). In general, it is typical that a ringing phenomenon has a very narrow pulse width, that is, it has different characteristics from a normal DQS signal. Accordingly, when a ringing phenomenon occurs, which has a time interval shorter than the time required until the DIS_DSB signal is enabled at the rising edge of the DQS due to the ringing, the prior art cannot prevent the write fail.

SUMMARY OF THE INVENTION

Accordingly, the present invention has been made to solve the above-mentioned problems occurring in the prior art, and it is an object of the present invention to provide a method for masking a ringing phenomenon, in which an enabling point of a DIS_DSB, which is a control signal for blocking a glitch of a DSF2 due to a ringing of a DQS, is advanced to be earlier than that of the prior art.

The present invention provides a method for masking a ringing phenomenon by synchronizing a DIS_DSB signal at the last falling edge of a normal DQS signal to be enabled.

In order to achieve the above object, according to one aspect of the present invention, there is provided a method for masking a ringing phenomenon in a DDR SDRAM comprising: in a write mode, generating a first and a second synchronizing signal by means of a DQS signal inputted from an exterior circuit, in order to synchronize input data; latching data in odd sequences from among the inputted data, which are sequentially inputted, at a rising edge of the first synchronizing signal, and latching data in even sequences from among the inputted data, which are sequentially inputted, at a rising edge of the second synchronizing signal; aligning the data in odd sequences and the data in even sequences at a falling edge of the DQS signal so that the odd and even sequenced data has the same synchronized timing; and blocking activation of the second synchronizing signal by means of a first control signal, the first control signal being synchronized with the falling edge of the last valid DQS signal that is normally inputted, so as to enable the blocking step and thereby mask the ringing phenomenon. That is the invention comprises a method for masking a ringing phenomenon that may be generated during operation of a DDR SDRAM, the method comprising the steps of generating first and second synchronizing signals synchronized with a DQS signal input, in order to synchronize the input data during a write mode, latching data from among the sequentially input data in odd sequences when input at a rising edge of the first synchronizing signal, and latching data from among the sequentially input data in even sequences when input at a rising edge of the second synchronizing signal, aligning the data in odd and even sequences at a falling edge of the DQS signal having the same timing, and blocking activation of the second synchronizing signal by means of a first control signal which is synchronized with the falling edge of the last normally input DQS signal, the blocking activation being enabled for a period having a length so as to mask the ringing phenomenon occurring after the last normally input DQS signal.

BRIEF DESCRIPTION OF THE DRAWINGS

The above and other objects, features and advantages of the present invention will be made more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
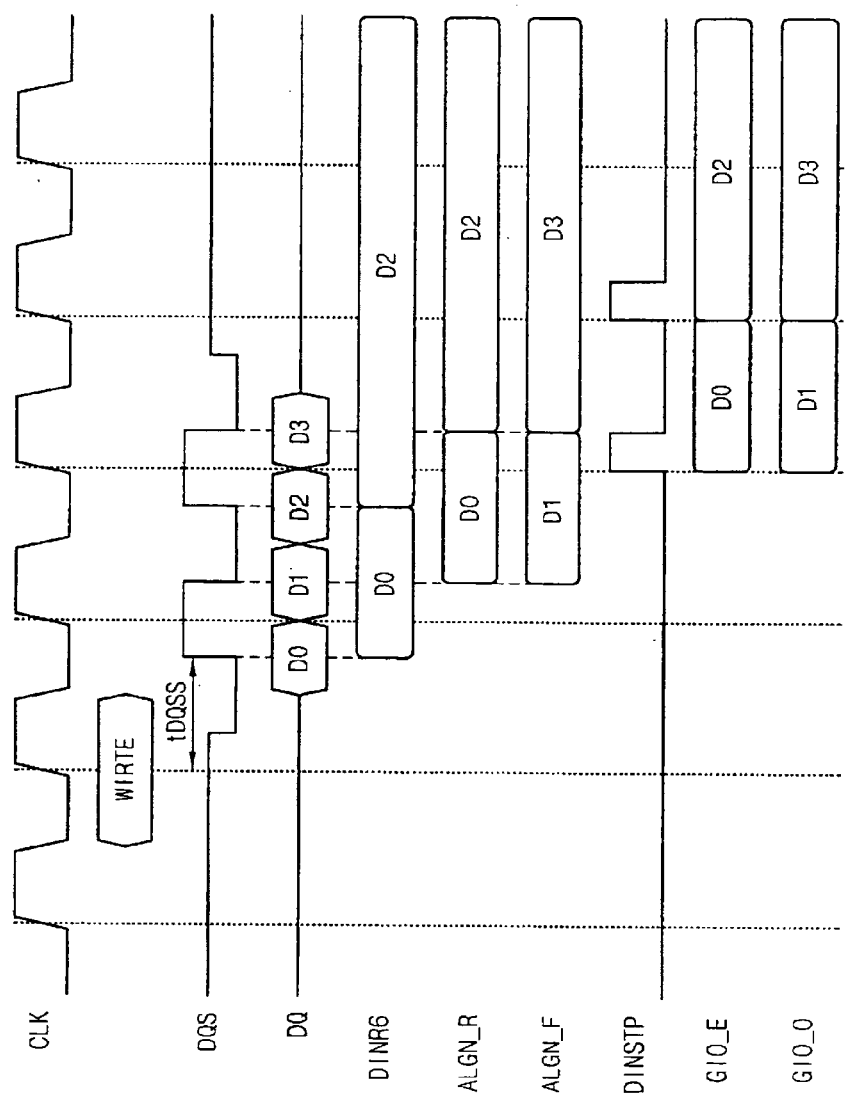
FIG. 1 is a time chart illustrating a general write operation of a conventional DDR SDRAM.
Figure 2:
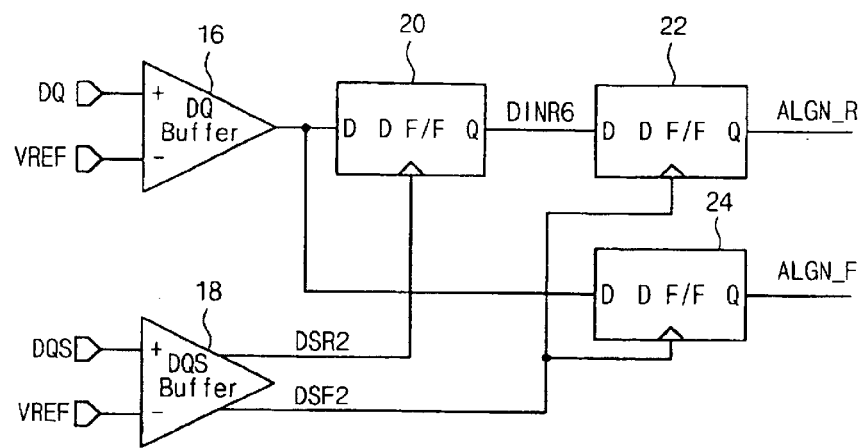
FIG. 2 is a block diagram of a data buffer and a DQS buffer generally used in a conventional DDR SDRAM.
Figure 3:
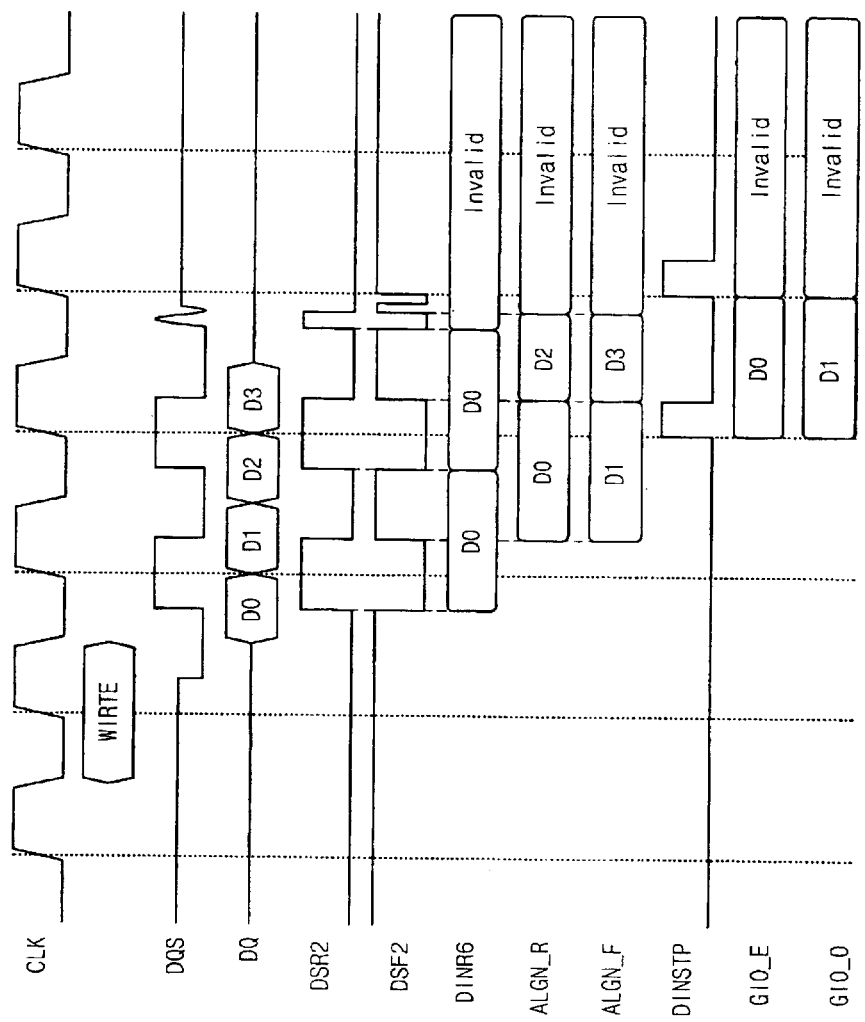
FIG. 3 is a time chart when a ringing phenomenon is caused in a write operation in a conventional DDR SDRAM.
Figure 7:
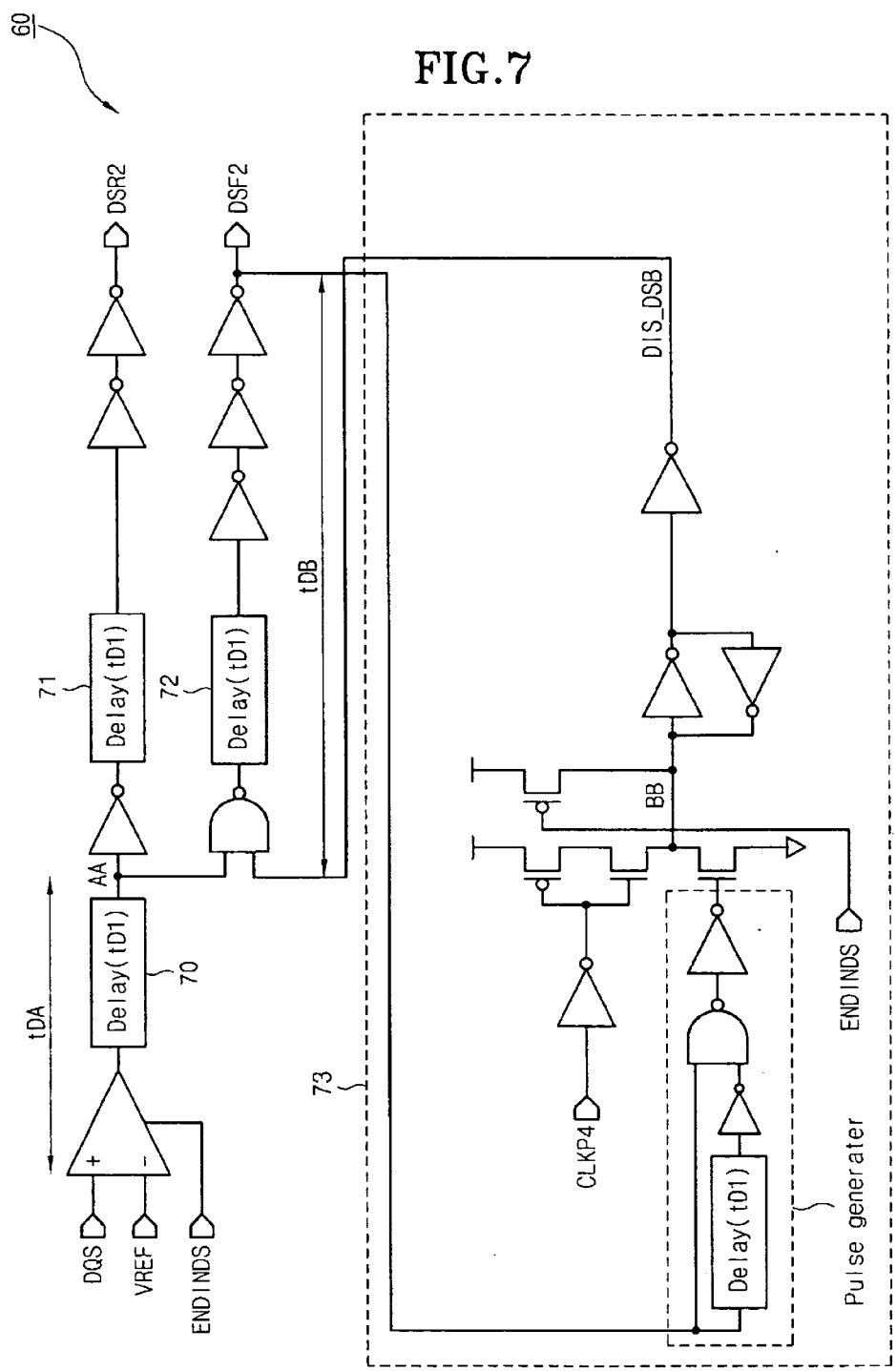
FIG. 7 is a block diagram of a DQS input buffer, which includes a circuit for masking a write fail due to a ringing, according to the present invention.

FIG. 7 is a block diagram illustrating a DQS input buffer 60, which includes a circuit for masking a write fail due to a ringing, according to the present invention. The DQS input buffer 60 may be utilized within the circuit shown in FIG. 2 to enable the masking of the ringing phenomenon.

Figure 4:
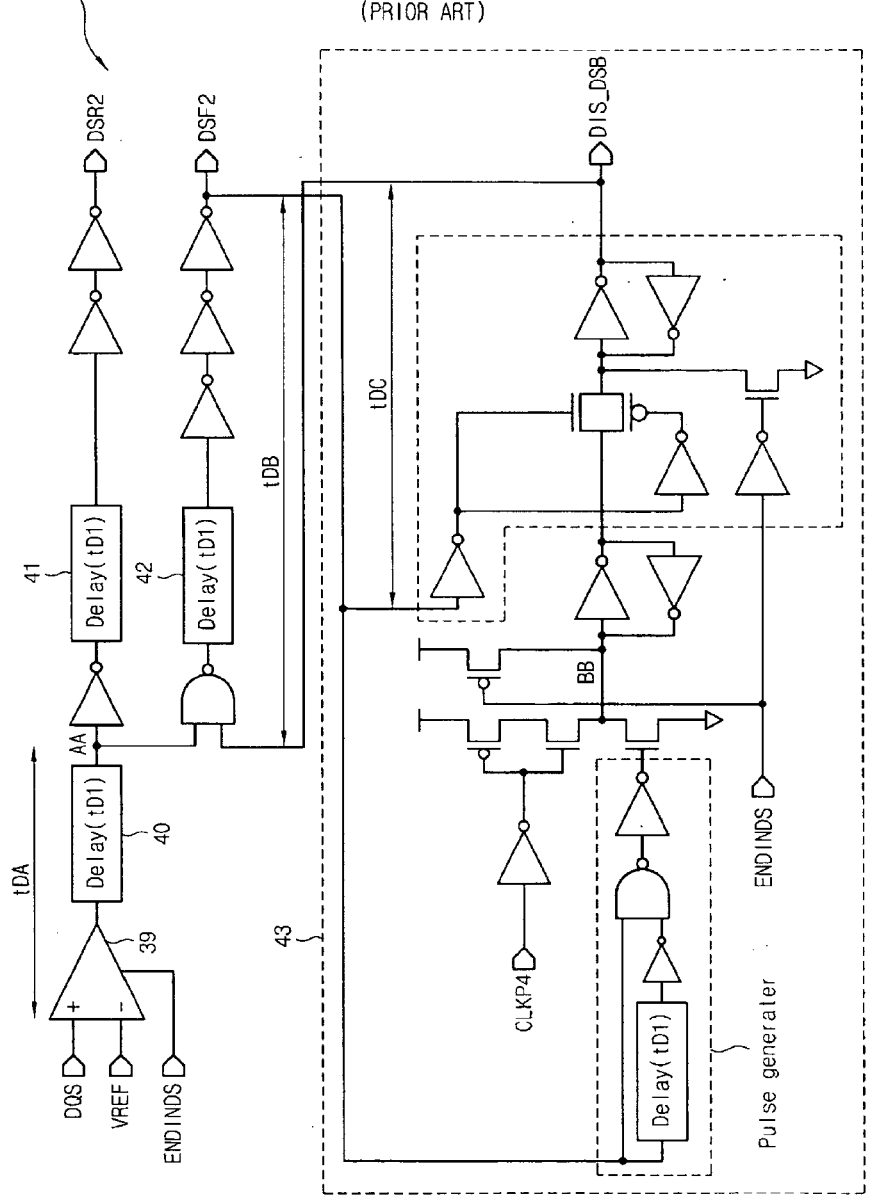
FIG. 4 is block diagram of a conventional DQS input buffer used for masking the aforementioned ringing phenomenon.

As shown in FIG. 7, the construction of the circuit according to the present invention has essentially the same construction as that of the circuit shown in FIG. 4, except for the construction of the circuit 73 for masking the write fail due to the ringing phenomenon.

Further, the circuit 73 shown in FIG. 7 for masking the write fail due to the ringing phenomenon is different from the circuit in FIG. 4, in that the circuit 73 does not have the delay block, as shown in the construction of FIG. 4 for causing the delay time tDC.

Figure 5:
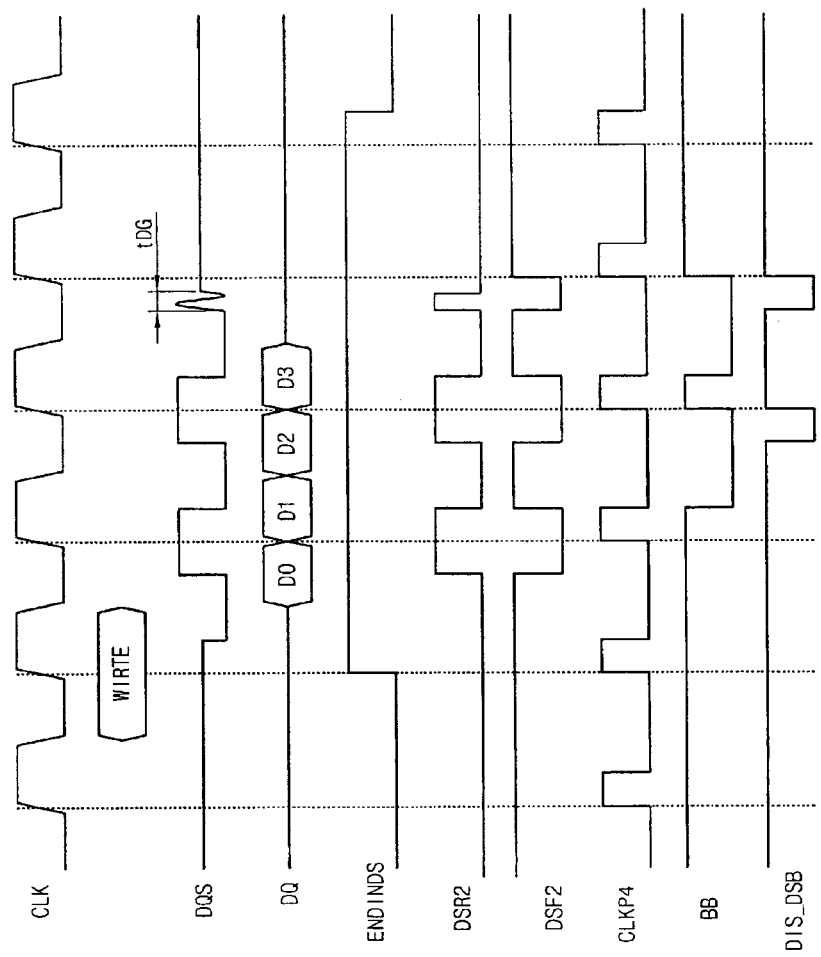
FIG. 5 is a time chart of the signals used in FIG. 4.
Figure 6:
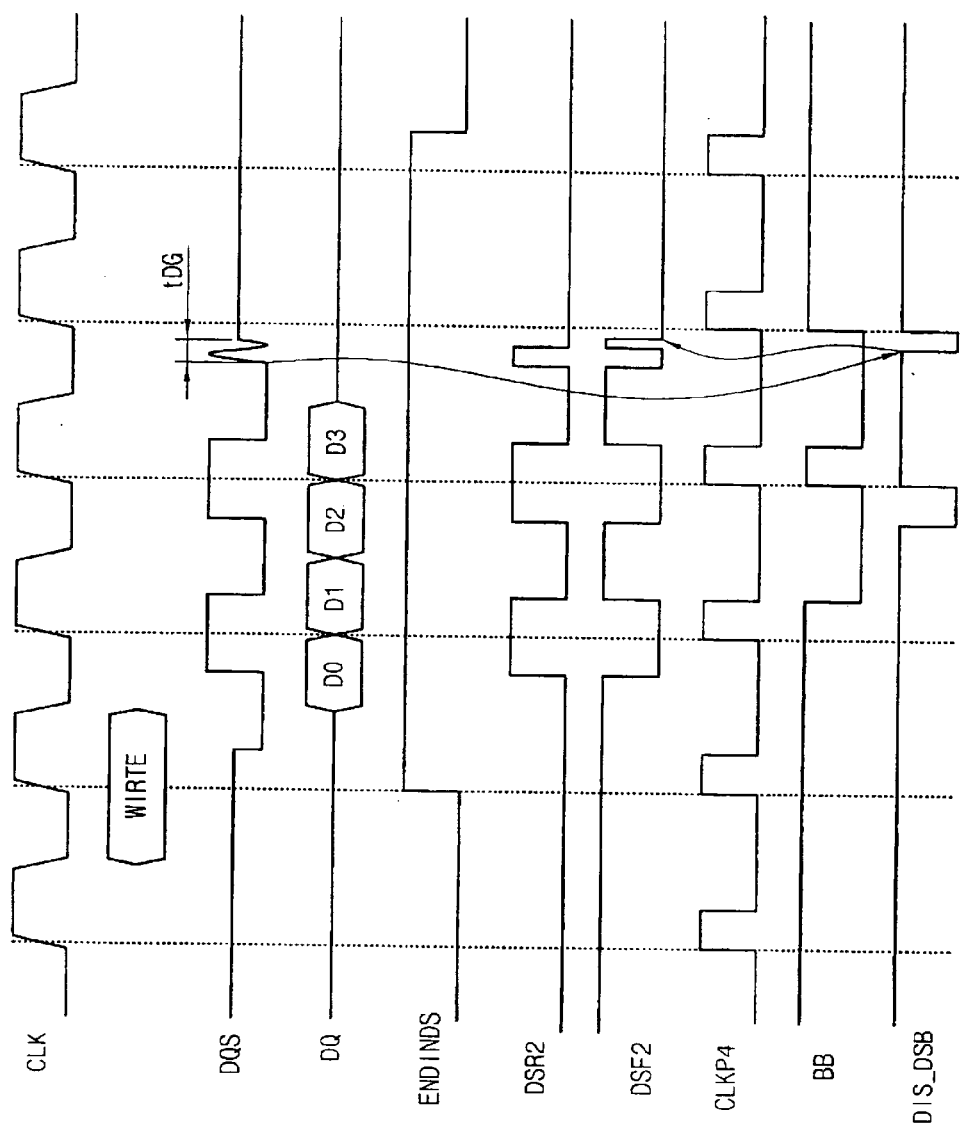
FIG. 6 is another time chart of the signals used in FIG. 4.

First, the operation of the circuit 73 for masking the write fail due to the ringing will be described with reference to the differences with FIG. 4 and FIG. 5.

In the conventional circuit as shown in FIG. 4, a latch is located before a driver outputting the DIS_DSB, and a transmission gate located at front of the latch is turned on when the DSF2 is in a low level state. Further, as shown in FIG. 5, a voltage at a node BB is enabled to a low state at the falling edge of the DQS signal (synchronized with rising edge of the DSF2 signal) and is then transmitted to the DIS_DSB. Herein, as shown in FIG. 5, the DIS_DSB signal is enabled at a low level state after a predetermined delay time tDC passes, and the predetermined delay time tDC is about 0.5*tCK.

Herein, the circuit 73 shown in FIG. 7 for masking the write fail due to the ringing phenomenon is different from the circuit in FIG. 4, in that the circuit 73 does not have any element for providing the delay time tDC caused by the circuit in FIG. 4, so that the DIS_DSB signal is enabled at a low level state without the delay of 0.5*tCK, that is produced in the prior art.

The main difference between the circuit in FIG. 4 and the circuit in FIG. 7 is that the circuitry for providing the delay time tDC caused by the circuit in FIG. 4 is removed from the circuit 73, as shown in FIG. 7, used for masking the write fail due to the ringing phenomenon, and the DIS_DSB signal is thus enabled at a low level state prior to the passage of the 0.5*tCK delay time in comparison to the prior art.

Figure 8:
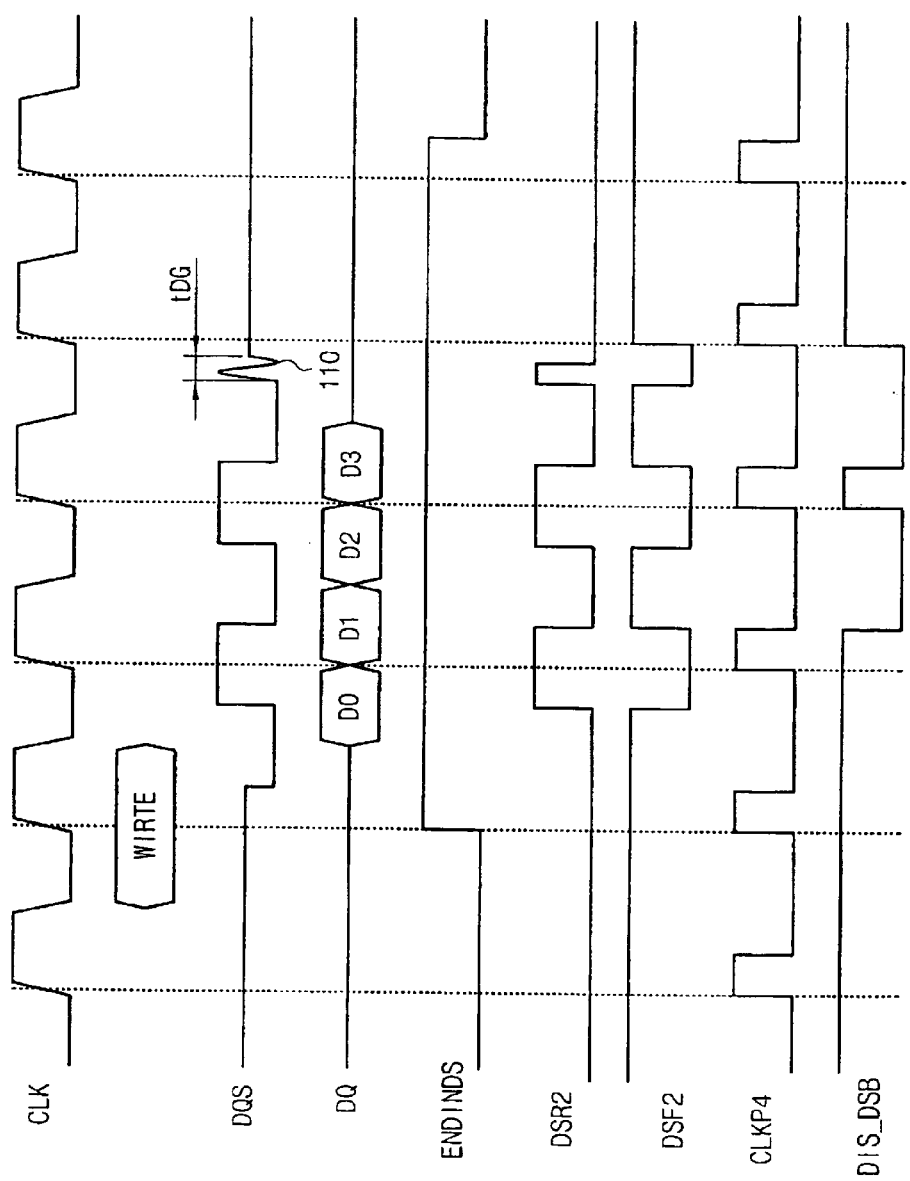
FIG. 8 is a time chart of the signals used in FIG. 7.

Further, the time chart shown in FIG. 8 will make this difference more clear.

In FIG. 8, CLK represents an internal clock signal, DQ represents data inputted from an exterior circuit, an END-INDS represents a signal which ENABLEs a DQS input buffer in a write operation, DSR2 and DSF2, respectively, each represent a synchronizing signal generated by a DQS signal and having opposite phase from the other, CLKP4 represents a signal generated by adjusting the high level pulse width of the clock signal CLK, and DIS_DSB represents a control signal for removing a glitch that may be generated in the DSF2 signal, which may occur as a result of the a DQS ringing phenomenon, and thereby preventing a write fail from occurring. For reference, the CLKP4 is synchronized with a rising edge of an internal clock signal in a DDR SDRAM, and is then shifted to a high level, and has the same period as that of the internal clock signal. Further, the high level intervals of the CLKP4 have a shorter duration than those of the internal clock signal.

As shown in FIGS. 7 and 8, since the delay time (tDC is about 0.5*tCK) is omitted by use of the circuit 73 for masking the write fail due to the ringing phenomenon, the DIS_DSB is thus enabled at a low level state without the approximate delay time of 0.5*tCK, in comparison to the prior art. Accordingly, even when a DQS ringing phenomenon having a narrow width occurs, the circuit 73 can block the glitch that is generated in the DSF2 signal, so as to prevent the write fail from being caused by the ringing phenomenon.

Further, the method for masking the ringing phenomenon in the DDR SDRAM according to the present invention can block the glitch generated in the DSF2, thereby preventing the write fail from being caused by the ringing phenomenon, by means of the control signal (DIB_DSB) which is synchronized with the falling edge of the last DQS signal, which is normally inputted, and is then enabled. Furthermore, as shown in FIG. 8, after the DIS_DSB is enabled at a low level state, the DIS_DSB is disabled at a high level state at the rising edge of the CLKP4. Accordingly, the DQS input buffer returns to a normal standby mode and is ready to receive the next valid data.

As described above, in the method for masking the ringing phenomenon according to the present invention, the point at which the DIS_DSB signal is enabled in a low state, is synchronized with the last falling edge of the normal DQS signal, and therefore the DSF2 signal is disabled from registering invalid data.

The preferred embodiment of the present invention has been described for illustrative purposes, and those skilled in the art will appreciate that various modifications, alterations, additions and substitutions are possible, without departing from the scope and spirit of the invention as claimed in the accompanying claims.

What is claimed is:

1. A method for masking a ringing phenomenon in a DDR SDRAM, the method comprising the steps of:

in a write mode, generating a first and a second synchronizing signal by means of a DQS signal inputted from an exterior circuit, in order to synchronize input data;

latching data in odd sequences from among the inputted data, which are sequentially inputted, at a rising edge of the first synchronizing signal, and latching data in even sequences from among the inputted data, which are sequentially inputted, at a rising edge of the second synchronizing signal;

aligning the data in odd sequences and the data in even sequences at a falling edge of the DQS signal so that the odd and even sequenced data has the same synchronized timing; and blocking activation of the second synchronizing signal by means of a first control signal, the first control signal being synchronized with the falling edge of the last valid DQS signal that is normally inputted, so as to enable the blocking step and thereby masking the ringing phenomenon.

2. The method as claimed in claim 1, wherein the first synchronizing signal has the same phase as that of the DQS signal and has the same waveform as that of the DQS signal, and the second synchronizing signal has a phase opposite to that of the first synchronizing signal and has the same waveform as that of the first synchronizing signal.

3. The method as claimed in claim 1, wherein the first control signal is disabled by a second control signal, and the second control signal is synchronized with a rising edge of an internal clock signal in a DDR SDRAM to be shifted at a high level, has the same period as that of the internal clock signal, and high voltage level intervals of the second control signal have a shorter duration than those of the internal clock signal.

4. The method as claimed in claim 2, after the first control signal is enabled, the first control signal is disabled at the rising edge of the second control signal.

5. A method for masking a ringing phenomenon that may be generated during operation of a DDR SDRAM, the method comprising the steps of:

in a write mode, generating first and second synchronizing signals synchronized with a DQS signal input, in order to synchronize input data;

latching data from among sequentially input data in odd sequences when input at a rising edge of the first synchronizing signal, and latching data from among the sequentially input data in even sequences when input at a rising edge of the second synchronizing signal;

aligning the data in odd and even sequences at a falling edge of the DQS signal having the same timing; and blocking activation of the second synchronizing signal by means of a first control signal which is synchronized with the falling edge of the last normally input DQS signal, the blocking activation being enabled for a period having a length so as to mask the ringing phenomenon occurring after the last normally input DQS signal.

* * * * *